US 6,580,494 B1

(12) United States Patent
Hall et al.

(10) Patent No.: US 6,580,494 B1
(45) Date of Patent: Jun. 17, 2003

(54) METHOD AND SYSTEM OF DISTORTION COMPENSATION IN A PROJECTION IMAGING EXPOSE SYSTEM

(75) Inventors: Richard Ronald Hall, Endwell, NY (US); Robert Lee Lewis, Apalachin, NY (US); How Tzu Lin, Vestal, NY (US); Peter M. Nichols, Johnson City, NY (US); Robert David Sebesta, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/198,383

(22) Filed: Jul. 16, 2002

(51) Int. Cl.⁷ .............................................. G03B 27/52
(52) U.S. Cl. ...................................................... 355/55
(58) Field of Search ............................... 555/53, 55, 52

(56) References Cited

U.S. PATENT DOCUMENTS

| 4,903,079 | A | | 2/1990 | MacAndrew | 355/235 |
|---|---|---|---|---|---|
| 5,402,205 | A | * | 3/1995 | Markle et al. | 355/53 |
| 5,448,333 | A | * | 9/1995 | Iwamoto et al. | 355/53 |
| 5,710,619 | A | | 1/1998 | Jain et al. | 355/50 |
| 5,739,964 | A | | 4/1998 | Allen | 359/727 |
| 5,781,346 | A | | 7/1998 | Allen et al. | 359/649 |
| 5,936,710 | A | | 8/1999 | Itoh et al. | 355/53 |
| 5,973,766 | A | | 10/1999 | Matsuura et al. | 355/52 |
| 6,163,366 | A | * | 12/2000 | Okamoto et al. | 355/53 |
| 6,249,336 | B1 | * | 6/2001 | Ota | 355/53 |
| 6,281,965 | B1 | * | 8/2001 | Nakashima | 355/53 |

* cited by examiner

Primary Examiner—Russell Adams
Assistant Examiner—D. Ben Esplin
(74) Attorney, Agent, or Firm—Patrick J. Daugherty; Driggs, Lucas, Brubaker & Hogg Co., LPA

(57) ABSTRACT

A photolithography imaging system and method that performs the tasks of mask alignment, panel recognition, establishing position offsets and adjusting mask rotation for accurate overlay imaging of the mask onto the panel, and correctly adjusting image magnification or reduction to properly size each stepped image to the panel distortion. This invention applies more directly to substrate panels whose dimensional stability is found difficult to control, repeatedly. More specifically, it applies to panels whose X axis distortion factor varies greatly from its Y axis distortion factor and the average adjustment of the image magnification or reduction does not satisfy tight registration requirements. What is new is that the calculation of the magnification or reduction adjustment is based on the mask image dimensions.

18 Claims, 4 Drawing Sheets

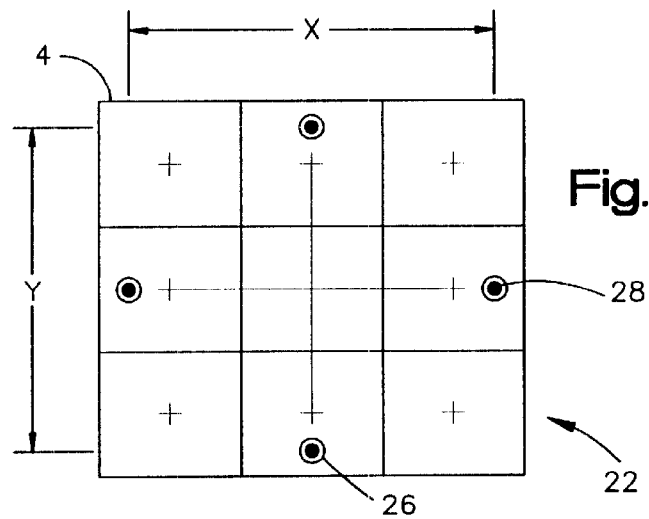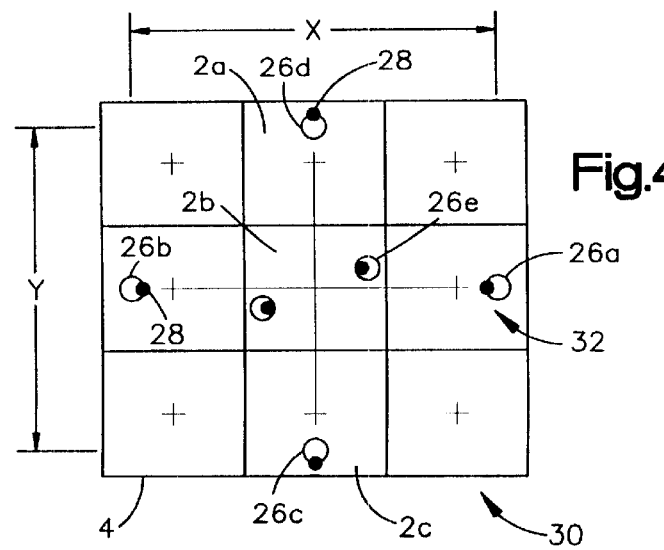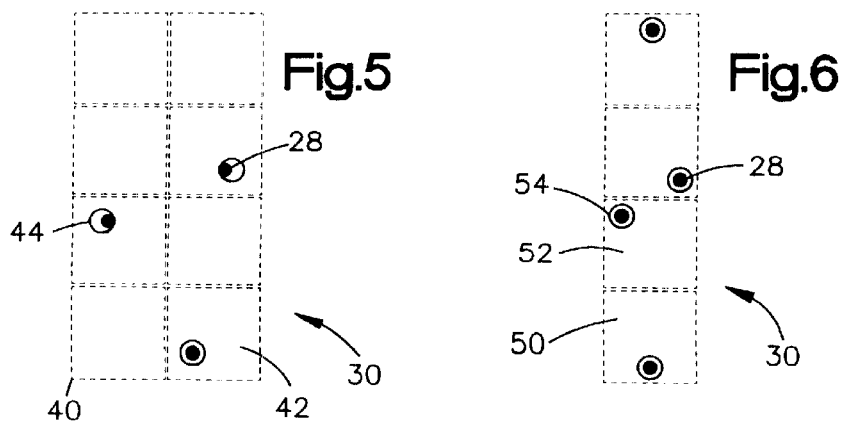

METHOD AND SYSTEM OF DISTORTION COMPENSATION IN A PROJECTION IMAGING EXPOSE SYSTEM

FIELD OF THE INVENTION

This invention relates to photolithography systems for high resolution circuit imaging, and specifically relates to step and repeat photo systems imaging multiple chip carriers through a projection lens onto large circuit panels or substrates. More particularly, this invention relates to photolithography systems employing a large area projection lens (e.g. 6–8 inch diameter field of view) and provides for a system and method of configuring the image magnification responsive to distortion factors observed in a panel receiving the image.

BACKGROUND OF THE INVENTION

The present invention relates to systems and methods of photolithography for exposing large substrates at high imaging resolutions. Examples of products manufactured by said processes include integrated circuits on silicon wafers, flat-panel displays on glass substrates, and multi-chip modules and printed circuit boards and laminate substrates. As is well known in the art, a circuit pattern or "mask" is exposed by projection onto a photosensitive substrate, such as a glass or metal substrate coated with a photo "resist." One method of projection exposure is known as the "step-and-repeat" method in which, after a mask pattern has been exposed onto a specific region of a substrate, the substrate is moved or "stepped" a specific distance and the mask pattern is then exposed again onto another portion of the substrate, resulting in a pattern or array of the same mask circuit repeatedly exposed upon the substrate surface. In the manufacturing of laminated chip carriers it is typical to fabricate multiples of one type of chip carrier on a larger planar circuit panel in this fashion, then singulate the individual carriers near the final stages of the panel build sequence. The mask used by the stepper image system is typically created on a Computer Aided Drawing ("CAD") system. The size of the mask, and the number and arrangement of individual circuit images defined by the mask, are determined responsive to the projected circuit size and required tolerances, the size of the field of view of the image projection system, and the characteristics of the panel substrate receiving the projected image.

Although it is typically desired that the panel substrate present a planar upper surface for receiving the projected image, in fact, the upper surface often diverges from a uniform planar shape. The common process steps utilized to fabricate a typical laminated substrate panel comprising epoxy resin and a fiberglass mesh substrate, from the beginning of circuitizing a chip carrier core and progressing to the outer layer circuit patterns, cause the physical dimensions of the resultant panel to change. Surface and dimensional anomalies are even more pronounced for laminate substrate structures fabricated with Teflon® and copper and without fiber reinforcing elements. The instability of the resultant structure is increased, with distortion factors varying by as much as 500 ppm along different portions of the substrate. Accordingly, it is common for large planar manufactured circuit panels, and in particular for laminated panel structures, to have surface anomalies that result in distortion of the upper planar surface, creating dimensional differences in both the X and Y axes of the upper planar surface of the panel.

When manufacturing multiples of smaller circuit patterns from a larger panel, large area "Stepper Projection Imaging" is one method of altering the whole panel image dimension by altering the magnification, and altering the repeating step increments to stitch together a pattern that matches the panel characteristics. (It is to be understood that altering or adjusting the magnification comprehends reducing as well as enlarging a mask image before projecting it upon a photosensitive substrate, conventionally with a projection lens.) As is well known in the art, a large area stepper expose tool projecting a chip carrier image through a 6–8" diameter 1-X lens can expose a multiple image stitched pattern of the chip carrier to provide a large panel image. With the use of a vision system, the tool can view alignment marks on the panel, and control an X/Y positioning system to move the panel into the correct registration to receive the projected mask image. The position of the alignment marks also are used to calculate the X and Y dimensions of the panel, along with the factors of dimension change. These factors are used to adjust X and Y step increments of the positioning system during the stitching of the complete panel circuit pattern.

The factors are also used in the control and adjusting of the magnification of the individual projected circuit patterns to best fit the panel dimensions. In prior art systems and methods, the magnification is usually adjusted to the average of the X and Y factors calculated from the panel alignment marks and, when imaging each circuit layer of a multilayered circuit panel, the image is typically altered to best fit the existing panel dimensions. While the step increments can be controlled independently in both X and Y axes, the magnification change of a typical 1x projection lens is in unity. Using multiple image mask patterns, designed to fill the diameter of the projection lens (e.g. 3×3, 3×4, or 2×3 pattern arrays), the projected image is altered by equal factors both X and Y axes. A problem occurs when the change in circuit panel dimensions of X and Y axes are greatly different, are. not predictable or repeatable, and the designed registration tolerances cannot be met. What is needed is a system and method of circuit panel imaging, by which stepper projection tool control, along with circuit mask design, can better accommodate unpredictable, independent X and Y dimensional differences.

SUMMARY OF THE INVENTION

The object of this invention is to provide a photolithographic imaging system and method that perform the tasks of mask alignment, panel recognition, establishing position offsets and adjusting mask rotation for accurate overlay imaging of the mask onto the panel, and correctly adjusting image magnification or reduction to properly size each stepped image to the panel distortion. This invention applies more directly to substrate panels whose dimensional stability is found difficult to control, repeatedly.

More specifically, it applies to panels whose X axis distortion factor varies greatly from its Y axis distortion factor and the average adjustment of the image magnification or reduction does not satisfy tight registration requirements. What is new is that the calculation of the magnification or reduction adjustment is based on the mask image dimensions.

BRIEF DESCRIPTION OF THE DRAWINGS

FIG. 3 is a top plan view of the multiple image mask pattern of FIG. 1 projected upon a planar substrate surface.

FIG. 4 is a top plan view of another embodiment of the multiple image mask pattern of FIG. 1 projected upon another planar substrate surface.

FIG. 5 is a top plan view of a 2-by-4 multiple image mask pattern according to the present invention as projected upon a planar substrate surface.

FIG. 6 is a top plan view of a 1-by-4 multiple image mask pattern according to the present invention as projected upon a planar substrate surface.

DESCRIPTION OF THE PREFERRED EMBODIMENTS

Figure 1:
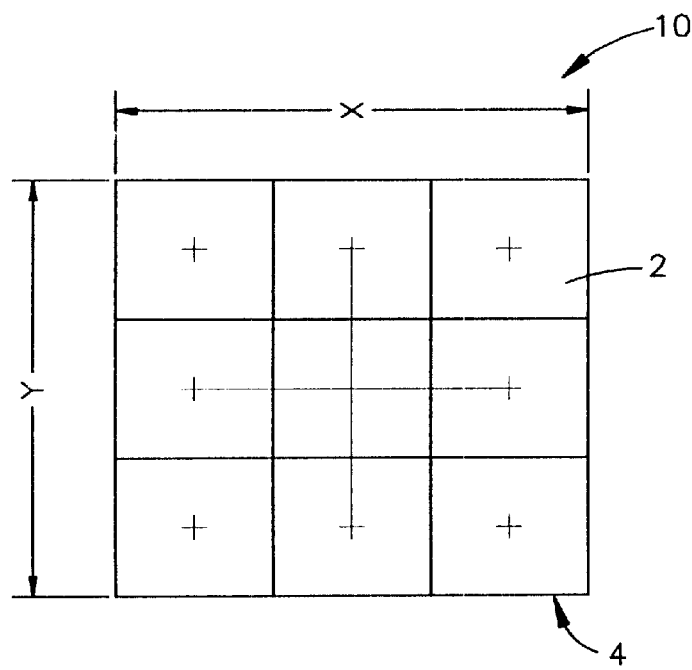
FIG. 1 is a top plan view of a 3-by-3 multiple image mask pattern.
Figure 2:
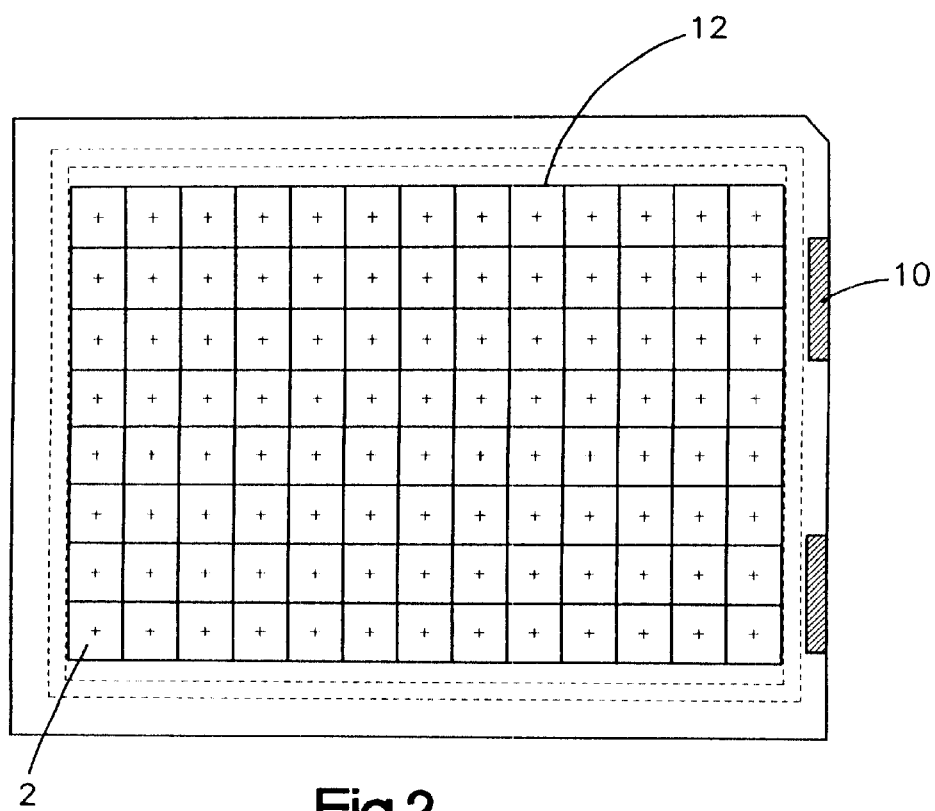
FIG. 2 is a top plan view of a composite array of multiple exposures of the multiple image mask pattern of FIG. 1 on a substrate panel.

FIG. 1 shows a typical multiple image mask pattern 4 as projected upon a planar substrate surface 10. The pattern 4 is a three-by-three (3×3) layout of multiple images of a typical 31 mm device image 2. This may be typically projected by a six inch field-of-view (FOV) projection lens with a prior art stepper projection imaging system and method, as is well known in the art. Stitching multiple exposures of this multiple image mask pattern 4 onto the substrate 10 according to a prior art stepper projection imaging system utilizing prior art tool compensation features produces the composite array 12 shown in FIG. 2. In creating the composite array 12 the stepper projection system must account for surface irregularities and anomalies, which result in X and Y distortions on the planar substrate surface 10. Prior art methods may provide the full panel exposure of FIG. 2 with accurate alignment to panel distortion, and providing the X and Y distortion of the panel is relatively consistent. Prior art system magnification is adjusted to compensate for the average of the X and Y panel distortion factors.

FIG. 3 shows the multiple image mask pattern 4 projected upon a planar substrate surface 22. The substrate surface 22 has a plurality of substrate alignment features, or "fiducials," 28. Fiducials may be alignment pins or dots, vias, through-holes, panel edges or any previously defined image landmarks on the substrate surface 22. The mask pattern 4 illustrated in FIG. 3 has a set of circular outer edge projections 26 corresponding to a set of substrate fiducial dots 28. If the substrate surface 22 is perfectly planar, with no surface anomalies or distortions, then the fiducials 28 would appear directly centered within the mask pattern edge projections 26. However, as shown in FIG. 3, the fiducials 28 are slightly expanded in the Y axis and slightly contracted in the X axis relative to the mask circular projections 26. Where the X and Y distortion of the substrate 22 has only slight differences (e.g. X=50–100 ppm<Y), but matching close enough to still provide adequate alignment to mask edge projections 26, prior art step and expose systems and methods may be used.

It is to be understood that the projections 26 are provided for illustrative purposes, and are not required to practice the present invention. They are used as a means to illustrate in visual terms how the alignment of the image 22 upon a substrate panel may diverge from its expected alignment with a set of fiducials 28. Furthermore, it is not required that the fiducials 28 occur within the mask image 22, and they may be outside of the mask image 22. For example, this will occur when the edge of the substrate is used as the fiducial 28. Accordingly, the fiducials 28 are not limited to the "dot" structure shown with the present embodiment.

FIG. 4 shows a view of the multiple image mask pattern 4 projected upon another planar substrate surface 30. Here the mask pattern outer edge projections 26 are complemented by two inner device edge alignment projections 26e, and the projections 26 are shown superimposed upon a corresponding set of substrate fiducials 28. The X and Y distortion of the substrate surface 30 is characterized by significantly greater relational differences between the X and Y axes (e.g. X=about 400 ppm<Y). As is apparent in FIG. 4, the X and Y distortion of the substrate surface 30 results in equal, but opposing, mis-registration of each of the substrate fiducials 28 to a corresponding alignment projection 26. Specifically, the fiducials 28 show significant mis-registration along the X axis relative to inner image projections 26e. Fiducials 28 show more significant mis-registration along the X axis with respect to projections 26a and 26b, and are in fact outside of acceptable tolerances as evidenced by portions of the fiducials 28 extending beyond the boundaries of projections 26a and 26b. In contrast, the fiducials 28 are properly aligned along the X axis but significantly and unacceptably mis-registered along the Y axis with respect to projections 26c and 26d, with substantial portions of the fiducials 28 aligned outside of projections 26c and 26d.

Both FIG. 3 and FIG. 4 represent prior art image magnification results wherein a typical six-inch FOV lens was adjusted through a prior art system and methodology. The resultant image magnifications were calculated using the average of panel distortion factors. As illustrated in FIG. 4, by merely adjusting the image magnification, prior art systems do not provide for acceptable results where there are significant relational differences between X and Y axis distortion factors. In higher density pattern designs, features become smaller, and registration tolerances are reduced. When combined with less stable substrate materials that contribute to varying distortion within the panel, and in particular where significant relational differences between X and Y axis distortion factors are present, mask patterns may be reduced from a 3×3 pattern to 2×2, or even a single device image, to maintain acceptable registration tolerances. The present invention provides a method and system for a stepper projection tool in which the tool provides a calculation of magnification adjustment that is variable and influenced by the mask pattern dimensions. If the mask pattern 4 in FIG. 4 was reduced to a 1×3 pattern, the alignment in the X axis would improve for each of the three individual column images, but the magnification, with the same calculations, would still not suit the Y axis tolerance. The center column of 31 mm device images 2a, 2b and 2c in FIG. 4 illustrates how a 1×3 mask pattern would align.

The method and system according to the present invention enables a projected mask pattern to meet registration tolerances for higher density designs by selecting a 2×4 or 1×4 layout and weighting the dimensions of the mask pattern to influence the calculation of magnification adjustment toward the longer dimension of the mask pattern. When design tolerances or material stability allow, the 3×3 mask application could still be used and the calculation would result in the average of the X and Y distortion factors as used in current practice. The mask image dimensions become included in the data used by a tool according to the present invention, along with data obtained from profiling a substrate panel by methods such as finding image locations marked upon a substrate panel FIG. 5 shows a multiple image mask pattern 40 according to the present invention as projected upon the planar substrate surface 30. Pattern 40 is a two-by-four (2×4) layout of multiple images of a 31 mm device image 44. Alignment projections 44 show acceptable alignment of the mask pattern 40 relative to substrate fiducials 28.

FIG. 6 shows another multiple image mask pattern 50 according to the present invention as projected upon the planar substrate surface 30. Pattern 50 is a one-by-four (1×4) layout of multiple images of a 31 mm device image 52. Alignment projections 54 show improved alignment of the mask pattern 50 relative to substrate fiducials 28 over the alignment achieved by pattern 40. Both pattern 40 and pattern 50 provide improved mask image registration for the 400 ppm delta in X and Y panel distortion of substrate surface 30, compared to the prior art imaged pattern 4 of FIG. 4.

Figure 7:
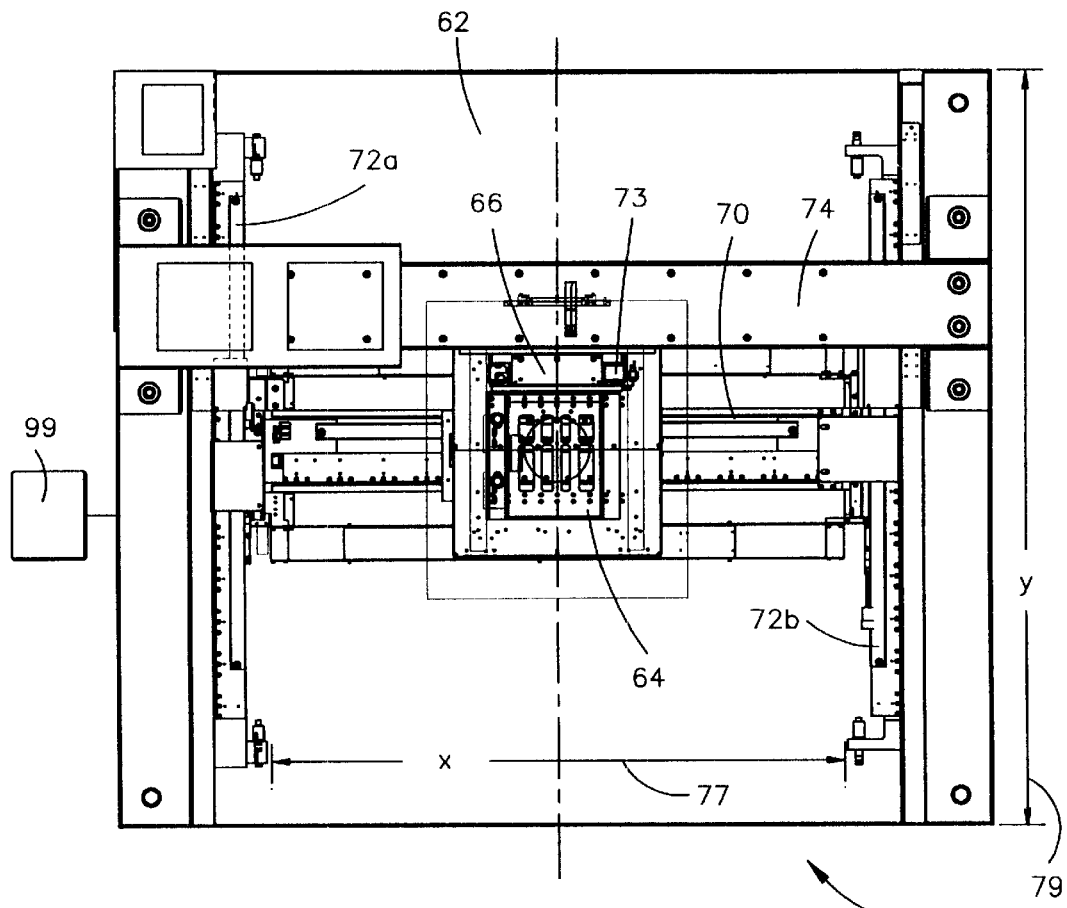
FIG. 7 is a side perspective view of an embodiment of a stepper image tool and system adapted to the present invention.

FIG. 7 shows an embodiment of the present invention incorporating a typical prior art stepper imaging tool 60. Examples of stepper imaging tools that may be utilized are those made by Tamarack Scientific Corporation, or by the Ushio Corporation. The tool 60 has a heavy vibration absorbing base 62, typically made from granite. A vacuum table 64 is provided for holding a panel or substrate securely and flat, and normal relative to an imaging system 66. The vacuum table 64 floats upon an "air-bearing" cushion above the base 62. The table 64 is moved along a Y axis 79 by linear motors 72a and 72b and along an X axis 77 by linear motor 70. The imaging system 66 is connected to a motorized suspension apparatus 73, and the apparatus 73, in turn, is connected to a heavy vibration-dampening bridge 74. The bridge 74 is firmly connected to the base 62 and spans above the table 64. The bridge 74 is also conventionally made out of granite. The suspension apparatus 73 enables the imaging system 66 to move along a Z axis normal to a plane defined by the X axis 77 and Y axis 79.

Figure 8:
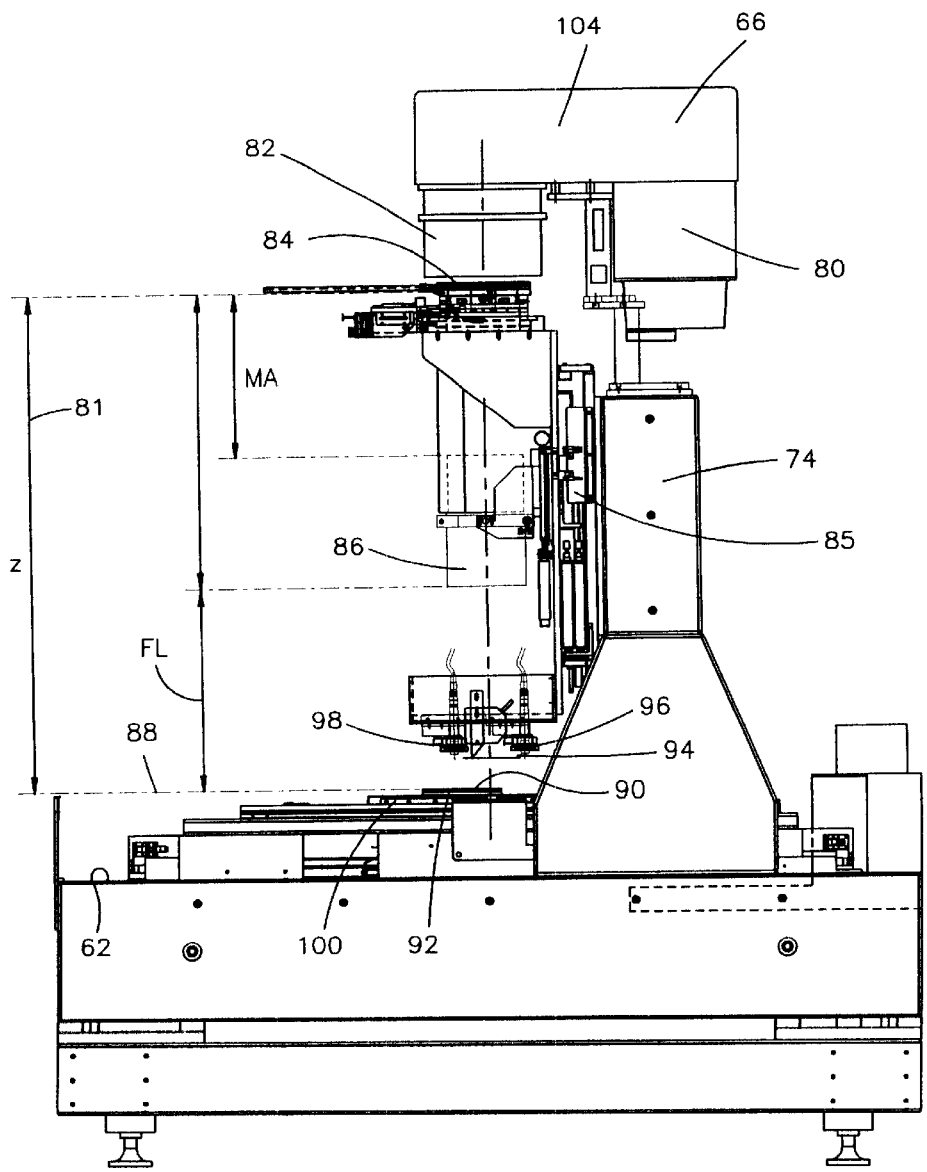
FIG. 8 is a side sectional view of a portion of an embodiment of a stepper image tool and system adapted to the present invention.

Referring now to FIG. 8, the imaging system 66 typically comprises a shuttered integrated light source 80. One embodiment of the light source 80 is a two kilowatt mercury arc lamp; however, different manufacturers may utilize different light sources, and other light sources may be used with the present invention. Light generated by the light source 80 passes through a condensing lens 82, a mask plane 84, an image mask 110, and a projection lens 86, which focuses the passed light into a mask image at the image plane 88. The mask plane 84 and projection lens 86 are commonly mounted to the imaging system 66 so that they may travel in unity along the Z axis, their motion and position along the Z axis controlled through use of sensors 85 interacting with the system controller 99 to maintain a proper focal length distance FL defined between the mask plane 84 and the image plane 88. The image plane 88 is the point of focus of the projected mask image and is, therefore, defined by the upper surface 90 of a substrate panel 92 affixed to the vacuum table 100. The projection lens 86 is adjusted along the Z axis relative to the mask plane 84 to select the magnification of a projected image upon the image plane 88. (It is to be understood that altering or adjusting the magnification comprehends reducing, as well as enlarging, a mask image before projecting it upon the substrate 92.)

Also included within the imaging system 66 is a vision system 94 used in substrate or panel recognition and profiling. The vision system 94 has at least one camera 96 and a lighting system 98 for illuminating the upper panel surface 90. The camera 96 receives panel alignment images from the illuminated panel surface 90 and sends the images to a system controller 99, such as a personal computer or networked computer system configured to control the stepper image tool 60.

The following is a sequence of tool functions that takes place to step image a mask pattern to fully cover a larger substrate or panel according to the present invention.

Figure 9:
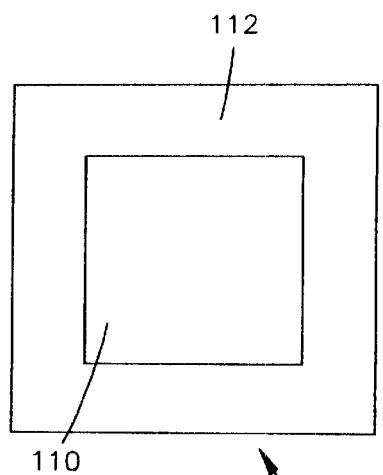
FIG. 9 is a block diagram view of a mask plane, mask holder and mask according to the present invention.
Figure 10:
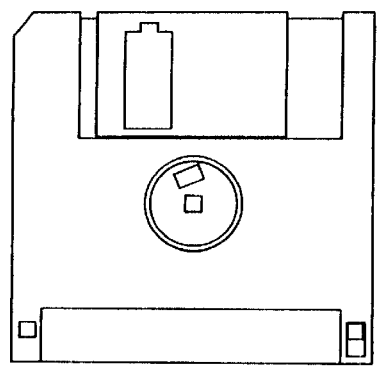
FIG. 10 is a graphical representation of a computer usable medium containing a computer readable program according to the present invention.

Referring now to FIG. 9, as is well known in the art, a mask 110 is loaded onto the mask plane 84 and a mask holder 112 automatically aligns the mask to a starting, or reference position, by rotating to align the mask and thereby "square" the mask with the table reference axes: X axis 77 and Y axis 79. As is also well known in the art, the substrate panel 92 is then loaded onto the vacuum table 100 using a mechanical pre-align method to locate the panel in a prescribed location, then securing with vacuum. A product type is selected on the stepper imaging tool 60 system controller 99, thereby loading a corresponding data set for the panel 92. This data set incorporates the known design locations of the circuit package array on the substrate panel, along with the design locations of the alignment features used as fiducials 28. Once the correct data has been loaded, the expose sequence is started. The stepper imaging tool 60 positions the panel 92 at a user prescribed location under the camera 96 and moves the projection lens 86 along the Z-axis 81 into the correct focal length distance FL. As is well known in the art and as discussed above, the tool 60 system controller 99 utilizes the camera 96 to locate a fiducial 28 on the surface of the panel 92. By comparing the observed position of the fiducial 28 along the tool X axis 77 and Y axis 79 with the positions predicted by the loaded data set, X axis and Y axis "offsets" are calculated for that prescribed location.

Next, the tool 60 system controller 99 moves the table 64 along the X axis 77 or Y axis 79 (or both) to position a second fiducial 28 under camera 96, compare it with its expected position as before, and calculate its offset. This process is repeated until a sufficient number of offset observations are acquired. As is well known in the art, offsets may be observed for every fiducial 28, or for only a sample set, such as a set of outside edge fiducials 28. Factors, such as the number of projections required for the panel 92, and the tolerances required, will determine the user-specified number of offset samples. Using the observed offset values, an X axis distortion factor and a Y axis distortion factor are calculated. The table 64 now moves to align the center of a first mask image site to a projected mask image center, the mask rotation is adjusted by the mask plane to match the panel rotation, and the magnification is adjusted by moving the projection lens 86 along the Z-axis 81. According to prior art methods and systems, the projection lens 86 magnification is adjusted according to an average of the X and Y distortion factors observed.

Next, the shutter 104 for the light source 80 opens and a system timer (not shown) holds it open for an amount of time responsive to an irradiance input and prescribed energy required for that product. The shutter 104 closes after the system timer countdown, completing the first site exposure. The tool 60 then repositions the table 64 along the X axis 77 or Y axis 79 (or both) into each of the next projection position sites and repeats the image projection steps at each site. For each of the table positioning steps, from one site to the next, the step increments are calculated and adjusted based on the average distortion factor. This is continued until all sites have been exposed, thereby providing a stitched pattern of smaller repeating images properly sized and aligned to all areas of the large panel dimensions. The table 64 is then returned to the starting position for unload/load functions, as is well known in the art.

What is new is the method and system of image magnification calculation according to the present invention. As in the above prior art example, all of the alignment features of a subject panel are observed, and calculations are made for observed panel distortion factors. What is new is that a mask image having one horizontal or vertical dimension longer than the other is chosen, and the image magnification is responsive to the distortion factors and the mask image dimensions, wherein the magnification of the tool projection lens, and thereby a resultant mask image, is adjusted to benefit the longer dimension of the mask. Where a mask image is equal in X and Y dimensions (for example 3×3 or 4×4 layouts), under the present invention, the imaging tool will automatically adjust to an average of the relative X and Y axis distortion factors, as in the prior art. However, where one of the X or Y dimensions is larger than the other, then the mask image will be adjusted more responsive to the distortion factor determined for the longer dimension axis. For example, the square 31 mm device image 2 may be arranged into a repeated rectangular 2×4, or strip 1×4 or 1×5, array structure. According to the present invention, the projection lens 86 magnification adjustment is skewed toward the longer dimension of the mask by giving more weight to the distortion factor associated with said longer dimension.

Registration accuracy tolerances in combination with circuit size determine possible mask image and array sizes. Depending upon the size of the circuit package, and more specifically the distance from the center of the projected circuit image outward to the edge of the image, the greater the distortion factor, the lesser the acceptable projected image size. Generally, a 100 parts per million (ppm) distortion factor roughly translates to about 0.1 mil, or about 2.5 microns per inch of distorted projection image. For example, for an image with 100 ppm distortion along the X axis, at a point about three inches from the center of the image along the X axis, there will be 7.5 microns of image distortion.

As is well known in the art, the engineering community has determined predicted distortion factors for substrate panel materials. The predicted factors are based upon the panel composition, the thickness and number of discrete layers within the panel, the processes used to fabricate the panels, and many other well known material and process characteristics. Accordingly, projected mask image size and array arrangements are selected based upon these known distortion factors.

The tolerances required for a given projected circuit will be based on the circuit size, circuit line size and density, number of vias, through-holes, acceptable misalignment with underlying circuitry, and other factors. Furthermore, some accuracy will be lost through "noise" in alignment mark recognition, and in the stepper tool table alignment accuracy.

Some packages may require plus or minus 1 mill of registration accuracy for the projected image with respect to the panel 92 alignment. A 1 mill registration tolerance will typically allow the use of a 3×3 mask application, and the prior art method of averaging the X and Y distortion factors would be appropriate. For epoxy resin/fiberglass laminate substrates, a 31 mm mask in a 3×3 (93×93 mm) array layout is typically appropriate, since there is typically no greater than about 100 ppm of total distortion factor discrepancy between the X and Y axes. Where the panel distortion factors are +300 ppm for X, and +100 ppm for Y, the average factor would be +200 ppm. Relative to the average, X would assume a value of +100 ppm and Y would be −100 ppm. For either X or Y, the mask ratio would be 1/1, or each is 100% of the other, and when the equal percentage is applied toward each of their respective 100 ppm, would still equal 200 ppm (e.g. 200 ppm "avg"+(100%)100 ppm "X"−(100%)100 ppm "Y"=200 ppm). In this case, 200 ppm best fits the application.

However, where the registration tolerance is about 10–12 microns, then the available mask array size is dependent upon the panel 92 material and structure. For a typical fiberglass mesh and epoxy resin, a 3×3 array may still provide acceptable results. But for epoxy resin board structures without fiber or mesh elements to stabilize the package, or for Teflon® and copper structures where there may be a large difference (or "delta") between the X and Y axis distortion factors, it is well known in the engineering community that a 3×3 array will not reliably produce a registration tolerance of about 10–12 microns. Based upon a large predicted distortion factor delta, a 2×4 or 1×4 array mask used in combination with the system and method of the present invention would be appropriate for such materials. Furthermore, for a registration tolerance of less than about 10 microns, a 1×4 or 1×5 strip mask used in combination with the system and method of the present invention would be indicated.

Importantly, under prior art systems and methods, where the X and Y axis dimensions average out to zero, such as where X axis has plus-200 ppm and Y axis has minus-200 ppm distortion, no magnification modification would be indicated. Under the present invention, however, by using a rectangular or strip mask array, the amount of relative distortion of each axis is weighted by its relation to the other axis. For example, if the mask pattern were 1×4, or 31 mm in X and 124 mm in Y, the ratio for X/Y is one-fourth, giving X 25% and Y 100% weighting factors. Applying the percentage to their assumed deltas: 0 ppm "avg"+(25%)200 ppm "X"−(100%)200 ppm "Y"=−150 ppm. Therefore, the magnification modification is adjusted in favor of the longer Y axis.

Conversely, distortions along the X axis are given less weight, and result is lessor magnification modification, since the distance from center of image to the end along the X axis is much less than that in the Y axis, resulting in much less image mis-registration compared to the Y axis distortion factor.

For a mask layout of 2×4, the calculation would equal −100 ppm. For the case illustrated in FIG. 5, the 2×4 layout with a 400 ppm delta in X & Y factors, this allows the longest axis to benefit from the factor calculated for that axis and still allows for multiple images to be exposed for each image site. The mask layout would be determined by the designed image alignment tolerances, along with the tool overlay capability. The tool would adjust automatically to the desired mask layout.

An alternative embodiment of a method and system according to the present invention is as follows: A "denominator" is derived by adding a mask X axis dimension to its Y axis dimension. The observed X axis distortion factor is then weighted by multiplying the X axis distortion factor by the mask X axis dimension and dividing by the denominator. In a similar fashion, the observed Y axis distortion factor is weighted by multiplying the Y axis distortion factor by the mask Y axis dimension and dividing by the denominator. A total distortion factor is then calculated by adding the weighted X distortion factor to the weighted Y distortion factor, and this total distortion factor is used to select the projection lens magnification.

This second embodiment is illustrated by the following exemplary "C++" computer program code sample for calculating magnification:

mag[i]=(long)(xmag*(foot_print.mask_x/(foot_print.mask_x+foot_print.mask_y)));

mag[i]+=(long)(ymag*(foot_print.mask_y/(foot_print.mask_x+foot_print.mask_y)));

The first line calculates the weighted magnification factor for the X axis mask dimension, wherein "xmag" is the X axis distortion factor as derived from fiducial offset measurements. The second line does the same calculation as the first line, only for the Y axis distortion factor, and adds it to the first value. To provide an illustrative example, if the "mask_x" and "mask_y" are the same, a "square" mask, and xmag=1 and ymag=1, then the first line will calculate a value of 0.5. (1 *(1/1+1)=1*(1/2)=0.5.). The second line calculates the same value, and adds it to the first, giving a total mag factor of 0.5+0.5=1.0. If the distortion factors are +1 and −1, then they will cancel each other out. (+0.5+(−0.5)=0). Since we're calculating a distortion magnification "factor", 0 means we will use our nominal magnification.

Table 1 illustrates another exemplary "C++" programming code program according to the present invention. For this embodiment of the invention, the calculation of distortion factors is accomplished by dividing the substrate panel into quadrants, and panel perimeter locations are used for the fiducials.

TABLE 1

```
// function name: align_part_perim
// purpose: aligns part to expose head
//              Uses the "perimeter fiducials"
//     Okay . . . here's the steps
//     1) locate fid 1
//     2) if number of fids = = 8, locate fid 7
//     3) locate fid 2
//     4) if number of fids > 4, locate fid 6
//     5) locate fid 4
//     6) if number of fids = = 8, locate fid 8
//     7) locate fid 3
//     8) if number of fids > 4, locate fid 5
//     calculate position of any fids not in FP file (5&6, and/or 7&8)
and panel center "X"
//     calculate "stretch/shrink" (mag) of X1, X2, X3, X4, X5, X6
//     calculate "stretch/shrink" (mag) of Y1, Y2, Y3, Y4, Y5, Y6
//     calculate "mag" factors for each image location
//            mag formula will be based on X/Y dimensions of
                 mask
//     Move to location -
//     1) determine quadrant
//     2) determine X "stretch/shrink" at Y position
//     3) determine Y "stretch/shrink" at X position
//     4) calculate X and Y positions to drive to
//     Drive to location & set mag
//            Panel layout and fiducial/line numbering scheme
//
```

TABLE 1-continued

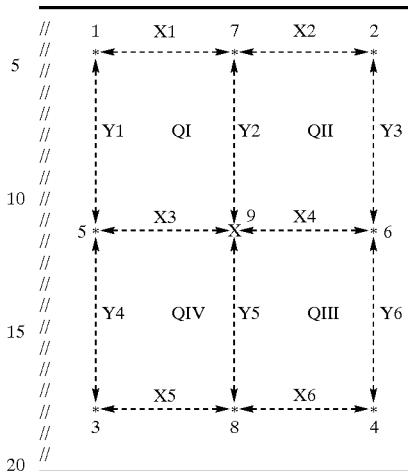

While preferred embodiments of the invention have been described herein, variations in the design may be made, and such variations may be apparent to those skilled in the art of making tools, as well as to those skilled in other arts. The materials identified above are by no means the only materials suitable for the manufacture of the tool, and substitute materials will be readily apparent to one skilled in the art. The scope of the invention, therefore, is only to be limited by the following claims.

What is claimed is:

1. A method of projection imaging comprising the steps of:

providing a substrate panel with a generally planar photosensitive surface for receiving a projection image, the planar surface having an X axis and a Y axis normal to the X axis;

providing an image mask parallel to and above the panel surface, the image mask having a horizontal side dimension and a vertical side dimension normal to the horizontal, wherein one of the horizontal and vertical dimensions is greater than the other;

aligning the horizontal mask dimension with one of the panel X or Y axes, and the vertical mask dimension with the other of the panel X or Y axes;

providing a projection lens between the mask and the panel for receiving and adjusting the size of a mask projection image, the lens having a range of magnification and reduction settings;

selecting a projection lens magnification or reduction setting responsive to an X axis distortion factor and a Y axis distortion factor, wherein the magnification or reduction selection is more responsive to the distortion factor of the X or Y axis aligned with the greater of the horizontal and vertical mask dimensions; and projecting a mask projection image from the mask through the projection lens upon the substrate surface.

2. The method of claim 1 wherein the step of selecting a projection lens magnification or reduction setting more responsive to the distortion factor of the X or Y axis aligned with the greater of the horizontal and vertical mask dimensions further comprises the steps of:

calculating an average of the X and Y distortion factors;

generating an X distortion factor non-weighted delta by subtracting the average from the X distortion factor;

generating a Y distortion factor non-weighted delta by subtracting the average from the Y distortion factor;

calculating a weighting ratio by dividing the smaller of the vertical and horizontal mask dimensions by the larger of said vertical and horizontal dimensions;

selecting the distortion factor delta of the X or Y axis aligned with the smaller of the horizontal and vertical mask dimensions multiplying the selected distortion factor delta by the weighting ratio, thereby generating a weighted delta;

calculating a composite weighted distortion factor by adding the distortion factor average to the weighted delta and the remaining non-weighted delta; and selecting the projection lens magnification or reduction setting responsive to the composite weighted distortion factor.

3. The method of claim 1 wherein the step of selecting a projection lens magnification or reduction setting more responsive to the distortion factor of the X or Y axis aligned with the greater of the horizontal and vertical mask dimensions further comprises the steps of:

calculating a denominator by adding the mask horizontal dimension to the mask vertical dimension;

generating a weighted X distortion factor by multiplying the X distortion factor by the mask horizontal or vertical dimension aligned to the X axis and dividing by the denominator;

generating a weighted Y distortion factor by multiplying the Y distortion factor by the mask horizontal or vertical dimension aligned to the Y axis and dividing by the denominator;

calculating a total distortion factor by adding the weighted X distortion factor to the weighted Y distortion factor; and selecting the projection lens magnification or reduction setting responsive to the total distortion factor.

4. The method of claim 1 wherein the photosensitive substrate surface is a glass substrate coated with a photo "resist."

5. The method of claim 1 wherein the photosensitive substrate surface is a metallic substrate coated with a photo "resist."

6. The method of claim 1, further comprising the steps of:

providing a plurality of fiducials on the planar surface;

providing a data set, the data set comprising a predicted X axis coordinate and a predicted Y axis coordinate for each of the fiducials;

observing an actual X axis coordinate and an actual Y axis for each of the panel fiducials;

calculating an X axis distortion factor by comparing the predicted fiducial X axis coordinate of each fiducial to the actual X axis coordinate for that fiducial;

calculating a Y axis distortion factor by comparing the predicted fiducial Y axis coordinate of each fiducial to the actual Y axis coordinate for that fiducial;

aligning a first panel projection site on said panel to said image mask responsive to the fiducials;

providing a light source above the mask;

projecting light from the light source through the mask, thereby generating a mask image;

the projection lens receiving the mask image, magnifying or reducing the mask image and projecting a magnified or reduced mask image upon the panel surface first site position.

7. The method of claim 6, further comprising the steps of:

providing a second site position on the panel surface;

utilizing the fiducials to position said second site of said panel in alignment to said image mask;

selecting a projection lens magnification or reduction setting responsive to the X and Y axis distortion factors, wherein the magnification or reduction selection is more responsive to the distortion factor of the X or Y axis aligned with the greater of the horizontal and vertical mask dimensions; and projecting light from the light source through the mask, thereby generating a mask image; and the projection lens receiving the mask image, and magnifying or reducing and projecting a magnified or reduced mask image upon the panel surface second site position.

8. An imaging projection system and apparatus, comprising:

a programmable system controller;

a table for receiving substrate panels having a generally planar photosensitive surface having an X axis and a Y axis normal to the X axis;

a mask holder connected to the system controller and configured to receive an image mask having a horizontal side dimension and a vertical side dimension normal to the horizontal, wherein one of the horizontal and vertical dimensions is greater than the other, wherein the mask holder is further configured to align either of the horizontal and vertical mask side dimensions with one of the panel X or Y axes, thereby aligning the other of the horizontal and vertical mask side dimensions with the other of the panel X or Y axes;

a projection lens with a range of magnification and reduction settings connected to the system controller and disposed below the mask holder and above the table, the projection lens configured to receive a mask image projected through an image mask held by the mask holder and magnify or reduce and project the mask image upon a substrate panel surface, the lens further configured to select a magnification or reduction setting responsive to the system controller;

wherein the controller system is programmed to select a projection lens magnification or reduction setting responsive to an X axis distortion factor and a Y axis distortion factor, wherein the magnification or reduction selection is more responsive to the distortion factor of the X or Y axis aligned with the greater of the horizontal and vertical mask dimensions.

9. The imaging projection system and apparatus of claim 8, wherein the controller system programming selecting a projection lens magnification or reduction setting more responsive to the distortion factor of the X or Y axis aligned with the greater of the horizontal and vertical mask dimensions further comprises:

a program step configured to calculate an average of the X and Y distortion factors;

a program step configured to then calculate an X distortion factor non-weighted delta by subtracting the average from the X distortion factor;

a program step configured to then calculate a Y distortion factor non-weighted delta by subtracting the average from the Y distortion factor;

a program step configured to then calculate a weighting ratio by dividing the smaller of the vertical and horizontal mask dimensions by the larger of said vertical and horizontal dimensions;

a program step configured to then select the distortion factor delta of the X or Y axis aligned with the smaller of the horizontal and vertical mask dimensions;

a program step configured to then multiply the selected distortion factor delta by the weighting ratio, thereby generating a weighted delta;

a program step configured to then calculate a composite weighted distortion factor by adding the distortion factor average to the weighted delta and the remaining non-weighted delta; and a program step configured to then select the projection lens magnification or reduction responsive to the composite weighted distortion factor.

10. The imaging projection system and apparatus of claim 8, wherein the controller system programming selecting a projection lens magnification or reduction setting more responsive to the distortion factor of the X or Y axis aligned with the greater of the horizontal and vertical mask dimensions further comprises:

a program step configured to calculate a denominator by adding the mask horizontal dimension to the mask vertical dimension;

a program step configured to calculate a weighted X distortion factor by multiplying the X distortion factor by the mask horizontal or vertical dimension aligned to the X axis and dividing by the denominator;

a program step configured to calculate a weighted Y distortion factor by multiplying the Y distortion factor by the mask horizontal or vertical dimension aligned to the Y axis and dividing by the denominator;

a program step configured to calculate a total distortion factor by adding the weighted X distortion factor to the weighted Y distortion factor; and a program step configured to select a projection lens magnification or reduction setting responsive to the total distortion factor.

11. The imaging projection system and apparatus of claim 8, wherein the photosensitive substrate surface is a glass substrate coated with a photo "resist."

12. The imaging projection system and apparatus of claim 8, wherein the photosensitive substrate surface is a metallic substrate coated with a photo "resist."

13. The imaging projection system and apparatus of claim 8 wherein the table is a movable table configured to move responsive to the system controller, and the substrate panel has a plurality of fiducials on the panel surface and a first image site position, further comprising:

a light source connected to the system controller;

a camera system connected to the system controller and configured to scan the panel surface fiducials; and a data set loaded into the system controller, the data set comprising a predicted X axis coordinate and a predicted Y axis coordinate for each of the fiducials;

wherein the controller system is further configured to use the camera system to observe an actual X axis coordinate and an actual Y axis for each of the panel fiducials, calculate the X axis distortion factor by comparing the predicted fiducial X axis coordinate of each fiducial to the actual X axis coordinate for that fiducial, calculate the Y axis distortion factor by comparing the predicted fiducial Y axis coordinate of each fiducial to the actual Y axis coordinate for that fiducial, and move the table to align a first site on the substrate panel to said image mask responsive to said fiducials.

14. The imaging projection system and apparatus of claim 13, wherein the substrate surface has a second image site position, and wherein the system controller is further configured to utilize the fiducials to move the table and thereby position said second site in alignment to said image mask, select a projection lens magnification or reduction setting responsive to the X and Y axis distortion factors, wherein the magnification or reduction selection is more responsive to the distortion factor of the X or Y axis aligned with the greater of the horizontal and vertical mask dimensions, and cause a mask image to be projected upon the second site.

15. An article of manufacture comprising a computer usable medium having a computer readable program embodied in said medium, wherein the computer readable program, when executed on a computer, causes the computer to select a projection lens magnification or reduction setting responsive to an X axis distortion factor and a Y axis distortion factor, wherein the magnification or reduction selection is more responsive to the distortion factor of the X or Y axis aligned with the greater of a horizontal mask dimension and a vertical mask dimension.

16. The article of manufacture of claim 15, wherein the computer readable program, when executed on a computer, further causes the computer to:

calculate an average of the X and Y distortion factors;

calculate an X distortion factor non-weighted delta by subtracting the average from the X distortion factor;

calculate a Y distortion factor non-weighted delta by subtracting the average from the Y distortion factor;

calculate a weighting ratio by dividing the smaller of the vertical and horizontal mask dimensions by the larger of said vertical and horizontal dimensions;

select the distortion factor delta of the X or Y axis aligned with the smaller of the horizontal and vertical mask dimensions;

multiply the selected distortion factor delta by the weighting ratio, thereby generating a weighted delta;

calculate a composite weighted distortion factor by adding the distortion factor average to the weighted delta and the remaining non-weighted delta; and select the projection lens magnification or reduction setting responsive to the composite weighted distortion factor.

17. The article of manufacture of claim 15, wherein the computer readable program, when executed on a computer, further causes the computer to:

calculate a denominator by adding the mask horizontal dimension to the mask vertical dimension;

calculate a weighted X distortion factor by multiplying the X distortion factor by the mask horizontal or vertical dimension aligned to the X axis and dividing by the denominator;

calculate a weighted Y distortion factor by multiplying the Y distortion factor by the mask horizontal or vertical dimension aligned to the Y axis and dividing by the denominator;

calculate a total distortion factor by adding the weighted X distortion factor to the weighted Y distortion factor; and select a projection lens magnification or reduction setting responsive to the total distortion factor.

18. The article of manufacture of claim 15, wherein the computer readable program, when executed on a computer, further causes the computer to:

calculate the X axis distortion factor by comparing a predicted X axis coordinate of each of a plurality of substrate panel fiducials to an observed X axis coordinate for each said fiducial; and calculate the Y axis distortion factor by comparing a predicted Y axis coordinate of each of the plurality of fiducials to an observed Y axis coordinate for each said fiducial.

* * * * *